(12) United States Patent
Qian et al.

(10) Patent No.: US 6,365,968 B1
(45) Date of Patent: Apr. 2, 2002

(54) POLYIMIDE/SILICON OXIDE BI-LAYER FOR BOND PAD PARASITIC CAPACITANCE CONTROL IN SEMICONDUCTOR ELECTRO-OPTICAL DEVICE

(75) Inventors: Yi Qian, Lowell; Hanh Lu, Lexington; Richard Sahara, Watertown, all of MA (US)

(73) Assignee: Corning Lasertron, Inc., Bedford, MA (US)

( * ) Notice: Subject to any disclaimer, the term of this patent is extended or adjusted under 35 U.S.C. 154(b) by 0 days.

(21) Appl. No.: 09/130,742

(22) Filed: Aug. 7, 1998

(51) Int. Cl.[7] .............................................. H01L 23/48
(52) U.S. Cl. ........................ 257/739; 257/753; 257/759
(58) Field of Search ................................ 257/739, 753, 257/759, 783

(56) References Cited

U.S. PATENT DOCUMENTS

| 4,377,815 A | 3/1983 | Henning et al. ......... 346/140 R |
| 4,424,527 A | 1/1984 | Rao et al. ..................... 357/71 |
| 4,468,850 A | 9/1984 | Liau et al. ..................... 29/569 |

(List continued on next page.)

FOREIGN PATENT DOCUMENTS

| EP | 0 146 811 | 7/1985 | ........... C08G/73/20 |
| JP | 59055038 | 3/1984 | ........... H01L/21/88 |
| JP | 63122187 | 5/1988 | ............. H01S/3/18 |
| JP | 02054993 | 2/1990 | ............ H05K/3/38 |

OTHER PUBLICATIONS

Buchwlater, et al., "Adhesion of Polyimide to Fluorine–Contaminated $SiO_2$ Surface. Effect of Aminopropyltriethoxysilane on the Adhesion," *J. Adhesion Sci. Technol.*, vol. 5(6) :449–457 (1991).

Ma, et al., "Use of High Temperature and High Humidity to Test the Adhesion of Sputtered Copper to a Polyimide Surface Modified by an AC Nitrogen Glow Discharge," *J. Adhesion Sci. Technol.*, vol. 9(4), pp. 487–499 (1995).

Cho, et al., "Effect of Silicon–Containing Polyimide on Adhesion Between Glass and Polyimide," *ANTEC*, pp. 2889–2893 (1995).

Liberman, et al., "Vapor Depsoiton of POlyimide: Segregation of Partially Reacted Species at the Polyimide/Si (100) Interface," *Thin Solid Films*, 305:26–29 (1997).

Matsuo, et al., "Advanced Applications of Lasers in Materials Processing," *Digest IEEE/LEOS*, 1996 *Summer Topical Meetings*, pp. 3–4 (Aug. 5–9, 1996).

Matsuo, et al., "Use of Polyimide bonding for Hybrid Integration of a Vertical Cavity Surface Emitting Laser on a Silicon Substrate," *Electronics Letters*, vol. 33(13) :1148–1149 (Jun. 19, 1997).

(List continued on next page.)

*Primary Examiner*—Jerome Jackson, Jr.
(74) *Attorney, Agent, or Firm*—Hamilton Brook Smith & Reynolds, P.C.

(57) ABSTRACT

An electro-optical, ridge-waveguide device and method for its fabrication utilizes a polyimide ridge-protection layer, which provides good ridge protection/planarization while minimizing parasitic capacitance. A silicon oxide interlayer is used between a metal contact layer and the polyimide. This interlayer facilitates the adhesion between the metal contact layer and the underlying device since good adhesion can be obtained between the silicon oxide layer and the polyimide layer and between the metal layer and silicon oxide layer. Preferably, the polyimide is roughened to increase the surface area contact between the polyimide layer and silicon oxide layer to further increase adhesion and thus the pull-off force required to separate the metal contact layer from the device. While such roughening can be achieved through plasma etching, in a preferred embodiment, the polyimide layer is roughened by patterned etching. Specifically, a patterned photoresist is used as a etch-protection layer to form a series of wells in the polyimide layer that have a pitch between 1 and 20 microns.

15 Claims, 13 Drawing Sheets

U.S. PATENT DOCUMENTS

| | | | |
|---|---|---|---|
| 4,605,942 A | 8/1986 | Camlibel et al. | 357/17 |
| 4,615,032 A | 9/1986 | Holbrook et al. | 372/45 |
| 4,654,120 A | 3/1987 | Dougherty | 156/651 |
| 4,805,184 A | 2/1989 | Fiddyment et al. | 372/96 |
| 4,851,368 A | 7/1989 | Behfar-Rad et al. | 437/129 |
| 4,870,468 A | 9/1989 | Kinoshita et al. | 357/17 |
| 4,935,936 A | 6/1990 | Nelson et al. | 372/46 |
| 4,958,202 A | 9/1990 | Kinoshita et al. | 357/17 |
| 5,042,045 A | 8/1991 | Sato | 372/46 |
| 5,052,005 A | 9/1991 | Tanaka et al. | 372/36 |
| 5,059,552 A | 10/1991 | Harder et al. | 437/129 |
| 5,084,893 A | 1/1992 | Sekii et al. | 372/46 |
| 5,099,488 A | 3/1992 | Ahrabi et al. | 372/361 |
| 5,133,840 A | 7/1992 | Buchwalter et al. | 205/167 |
| 5,138,626 A | 8/1992 | Yap | 372/46 |
| 5,151,304 A | 9/1992 | Lee | 427/250 |
| 5,173,913 A | 12/1992 | Kaneno | 372/46 |
| 5,214,661 A | 5/1993 | Blondeau et al. | 372/45 |
| 5,217,599 A | 6/1993 | Chen et al. | 205/196 |
| 5,237,639 A | 8/1993 | Kato et al. | 385/131 |
| 5,307,357 A | 4/1994 | Jost et al. | 372/7 |
| 5,462,268 A | 10/1995 | Viehbeck et al. | 156/281 |
| 5,470,786 A | 11/1995 | Irikawa et al. | 437/129 |
| 5,567,981 A * | 10/1996 | Bhansali | 257/753 |
| 5,621,246 A * | 4/1997 | Motoyama | 257/753 |
| 5,639,693 A | 6/1997 | Koseki et al. | 437/209 |
| 5,647,785 A | 7/1997 | Jones et al. | 445/24 |
| 5,658,824 A | 8/1997 | Itoh et al. | 438/38 |
| 5,688,698 A | 11/1997 | Robinson et al. | 437/3 |
| 5,753,524 A | 5/1998 | Bodere et al. | 437/39 |
| 5,771,257 A | 6/1998 | Takiguchi et al. | 372/50 |

OTHER PUBLICATIONS

Ash, et al., "High–Speed, Self–Aligned, 1300 nm Buried Ridge Laser Suitable for Integration," *IEE Proceedings*, vol. 137, Pt. J, No. 5, pp. 315–317 (Oct. 1990).

"Pyralin, Polyimide Coatings for Electronics," VM–651 and VM–652 Adhesion Promoters, DuPont, (Technical Information) (Effective Jun. 1997).

* cited by examiner

POLYIMIDE/SILICON OXIDE BI-LAYER FOR BOND PAD PARASITIC CAPACITANCE CONTROL IN SEMICONDUCTOR ELECTRO-OPTICAL DEVICE

BACKGROUND OF THE INVENTION

As device speeds increase, parasitic capacitance increasingly becomes a design factor. This is especially true more recently in semiconductor electro-optical devices. As the optical qualities continue to be incrementally refined, parasitic capacitances in these already small devices become the criticality in the speed of operation.

In electro-optical devices, the metal contact layers and wire bond pads give rise to a large proportion of total device capacitance. For example, considering the example of ridge-waveguide architectures, ridge structures function as waveguides in optically-active epitaxial layers (epilayers) to produce lasers and modulators, or even passive waveguides. In most configurations, the ridge is etched into the epilayers, and a wire bond pad is constructed adjacent to the ridge. A p-metal contact layer, below the pad, conducts current between the pad and the top of the ridge structure so that current is injected down through the ridge and the underlying active layer to the substrate. Current is controlled to be injected only through the ridge by a passivation/insulation layer that is located between the semiconductor and metal contact layer in all places but the ridge top. The current is injected to create light generation at the active layer in the case of a laser. It also can apply the reverse bias voltage to control the absorption properties in the case of a modulator. Other cases include an optical switch, optical detector, optical amplifier, or integrated waveguide device in which at least two of the mentioned devices are integrated. In these devices, the largest structures are the bond pads adjacent to the ridge, which are capacitively coupled to the typically grounded substrate of the device.

In the past, silicon oxide, i.e., silicon dioxide, has been used under the metal contact layer and bond pad as the passivation layer and to facilitate planarization, if necessary. There are certain advantages associated with this material system. Silicon oxide deposition processes are well-known and integrated into existing fabrication lines, and it further adheres well to gallium arsenide- and silicon-based substrates. Moreover, good adhesion can be obtained between the metal contact layers and the silicon oxide, reducing the risk of wire pull-off after wire bonding processes to the wire bond pad.

Silicon oxide, however, has drawbacks that are related to the device's electrical properties. Silicon oxide's dielectric properties create intrinsic limitations. Moreover, capacitance is proportional to the size of conductors and inversely proportional to the distance between conductors. Assuming that the size of the bond pad can not be made smaller due to the mechanics of wire bonding to the pad, the only way to decrease capacitance is to increase the distance between the contact layer and substrate, but stress-free silicon oxide layers of a micron or thicker are difficult to produce. Thus, a different material system is needed to further reduce capacitance.

Accordingly, some have replaced silicon oxide with polyimide passivation layers. Polyimide has considerably more favorable dielectric properties, can be similarly integrated into the existing device fabrication production lines, and has well characterized performance in electronic devices through its ubiquitous use in electronic circuit boards. This has occurred because of polyimide's attractive balance of thermal, mechanical, and electrical properties.

SUMMARY OF THE INVENTION

Experimentation has exposed a problem associated with the use of polyimide as an insulation layer. Poor adhesion at the polyimide layer in semiconductor systems can raise performance issues in commercial-grade devices.

Adhesion of the polyimide to the semiconductor layer, such as a silicon oxide coverage layer, can be controlled. Recent developments in adhesion promoters facilitate the chemical preparation of silicon oxide passivation layers, for example, to receive the polyimide.

The problems instead arise when the metal contact layers are deposited on the polyimide. Good adhesion is required because wire bonding processes, such as ultrasonic wire bonding, create substantial mechanical stress at the polyimide/contact layer junction. This can cause substantial failures at the time of wire bonding or later during deployment at the junction. In most cases, such uncertainties are unacceptable in a commercial device.

The present invention is directed to an electro-optical device and method for its fabrication. The invention utilizes a polymeric dielectric layer, which preferably polyimide. Consequently, capacitance is minimized because of polyimides favorable dielectric properties and the thickness to which it can be deposited to facilitate the high speed operation of the device. According to the invention, however, a silicon oxide interlayer is used between the metal contact layer and the polyimide. This bi-layer of silicon oxide and polyimide facilitates the ultimate adhesion between the metal contact layer and the underlying device since good adhesion can be obtained between the silicon oxide layer and the polyimide layer with the invention and between the metal layer and silicon oxide layer.

Preferably, the polyimide is roughened to increase the surface area contact between the polyimide layer and silicon oxide layer to further increase adhesion and thus the pull-off force required to separate the metal contact layer from the device. While such roughening can be achieved through plasma etching, in a preferred embodiment, the polyimide layer is roughened by patterned etching. Specifically, a patterned photoresist is used as a etch-protection layer to form a series of wells in the polyimide layer. Preferably, the pitch between successive wells is 1 to 20 microns.

This approach is also useful in reverse-ridge configurations where, with conventional processes, it is additionally difficult to obtain good silicon oxide coverage underneath the ridge overhang and thus planarization.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the drawings, like reference characters refer to the same parts throughout the different views. The drawings are not necessarily to scale, emphasis instead being placed upon illustrating the principles of the invention. Of the drawings.

DETAILED DESCRIPTION OF THE INVENTION

Figure 1:
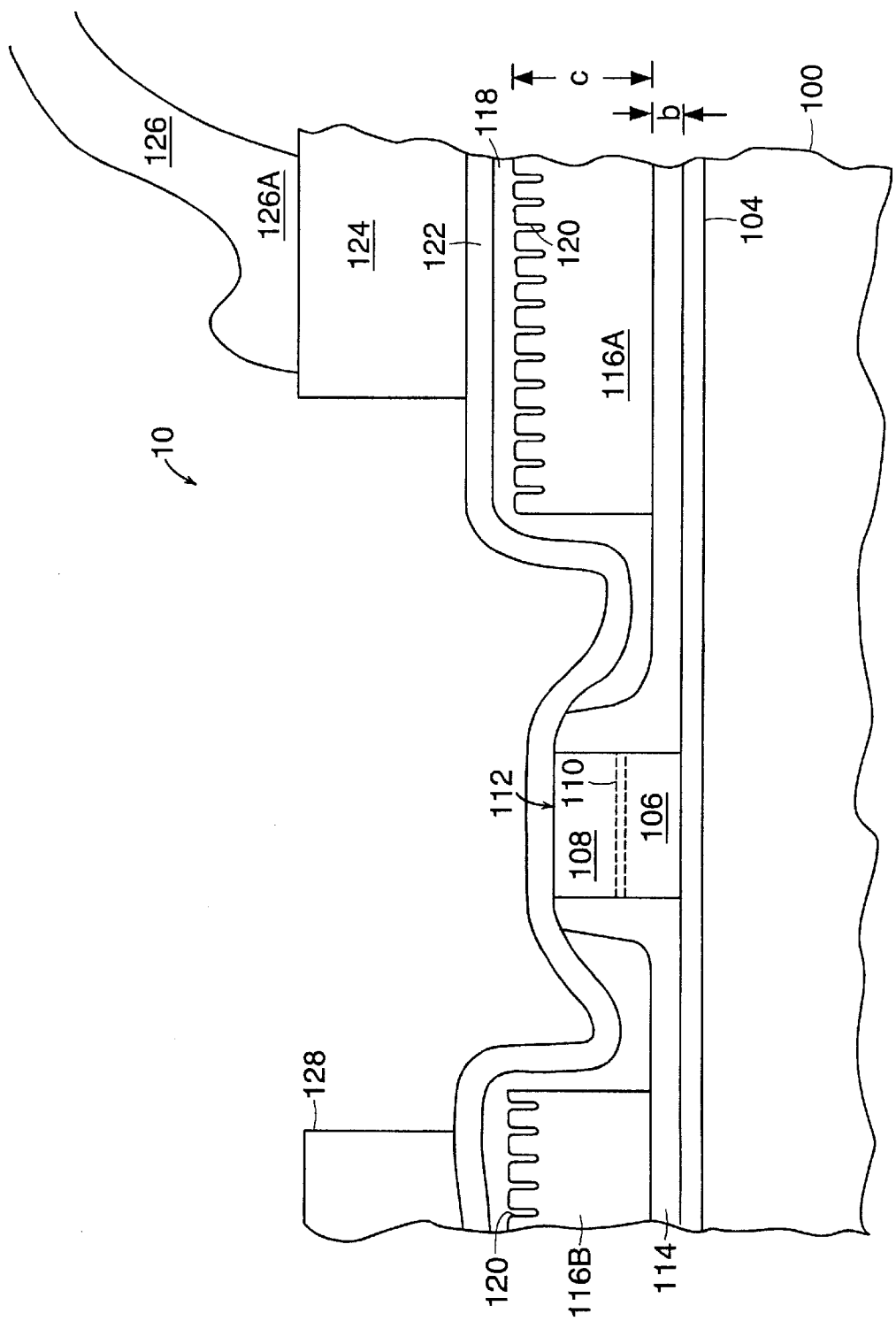
FIG. 1 is a cross-sectional view of an electro-optical ridge-waveguide modulator according to the present invention.

FIG. 1 is a cross-sectional view of a ridge-waveguide modulator 10, which has been constructed according to the principles of the present invention.

The substrate material 100 is preferably indium phosphide InP. An epitaxial InGaAsP layer 104, used as an etch stop layer during processing, covers the substrate. A preferably indium aluminum gallium arsenide InAlGaAs or indium gallium arsenide phosphide InGaAsP epitaxial active layer 110, which is confined within a ridge 112, provides the electro-optical characteristics of the device. The active layer 110 is bounded above and below by cladding layers 106, 108, which are preferably InP.

A silicon oxide passivation layer 114 is deposited on the etch stop layer 104 and on the side walls of the ridge 112. In a preferred embodiment, the silicon oxide passivation layer can be relatively thin, 2000–5000 Angstroms (Å) thick, since a polyimide layer 116A,B is used for capacitance reduction through the separation of p-metal layer 122 from the usually grounded substrate 100. A silicon oxide interlayer 118 is deposited on the polymeric dielectric layer 116, which is polyimide.

The polyimide layer 116A,B is roughened prior to the application of the silicon oxide interlayer 118. This is performed to increase the surface area of the interface between the interlayer 118 and polyimide layer 116. While the roughening is performed through plasma etching, for example in some embodiments, in the preferred embodiment, the surface area of the polyimide is increased by forming a series of etched wells 120 in the top surface of the polyimide layer 116. The pitch of these wells, i.e., the distance between the centers of successive wells is preferably 1 to 20 microns. A pitch of 8 microns is used in the preferred embodiment. The depth of the wells is approximately 0.3–2.0 microns, preferably 0.7 microns.

The p-metal contact layer 122 is deposited on the silicon oxide interlayer 118 with an ohmic contact to the top of ridge 112. In a preferred embodiment, the contact layer is a tri-metal of titanium, platinum, and gold . A large bond pad 124, 128 of gold is then formed on the contact layer 122, adjacent to the ridge, to receive a wire 126, with a wire ball 126A formed on the pad 124, preferably by ultrasonic wire bonding. A ridge injection current from wire 126 is conducted down through the ridge 112 through the active layer 110 by the p-metal contact layer 122.

Figure 2:
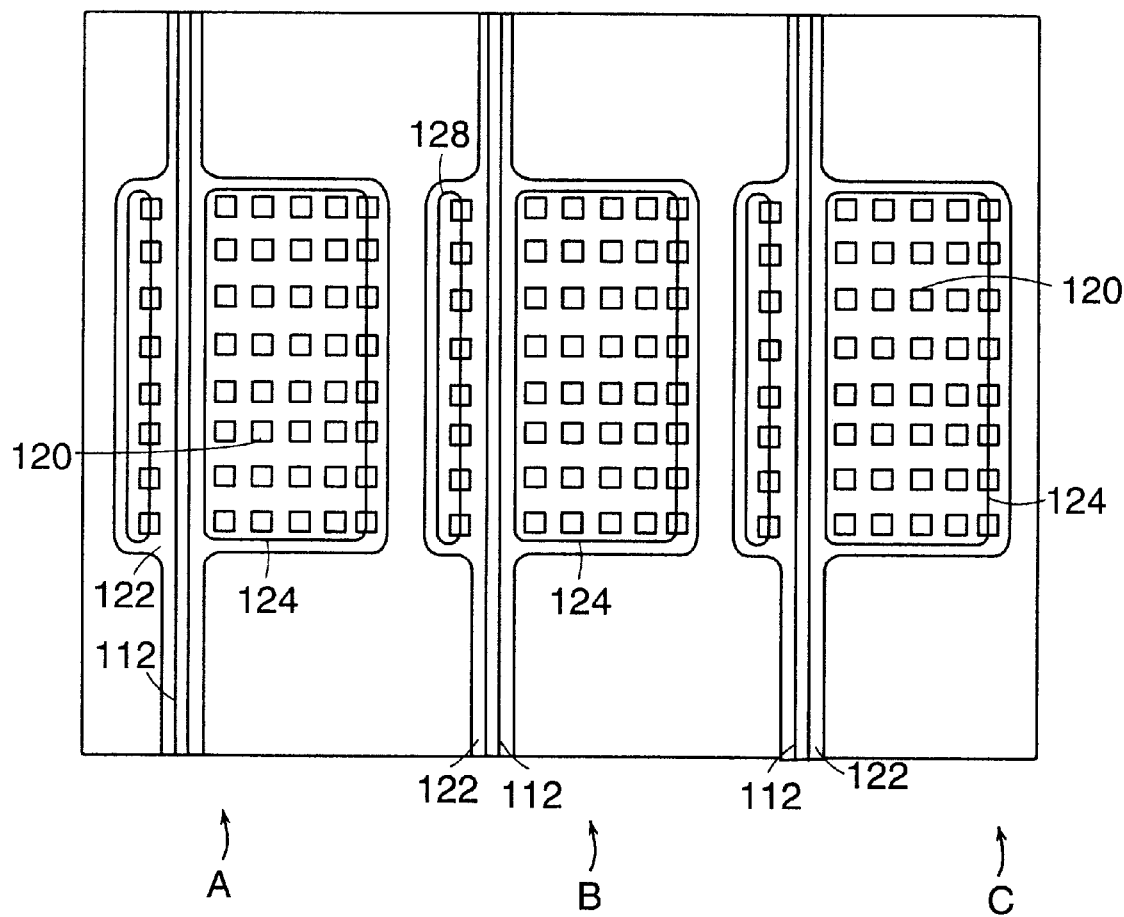
FIG. 2 is a top plan view of the electro-optical ridge-waveguide modulator showing the extent of the metal contact layer and wire bond pads prior to chip separation, according to the present invention.

FIG. 2 is a top plan view showing three A, B, C ridge-waveguide modulators of a wafer prior to scribing/cleaving separation into individual devices. Each has the ridge 112 and the metal contact layer 122 running the length of the ridge. The metal contact layer 122 also underlies the bond pad 124. Also shown are the square wells 120, which have been formed in the underlying polyimide layer 116 to facilitate the adhesion of the silicon oxide interlayer 118, covering all areas on the semiconductor except the tops of the ridges 112, and thus the adhesion of the metal bond pad 124 to the device.

FIGS. 3 through 10 illustrate the process for manufacturing the inventive ridge-waveguide modulator 10.

Figure 3:
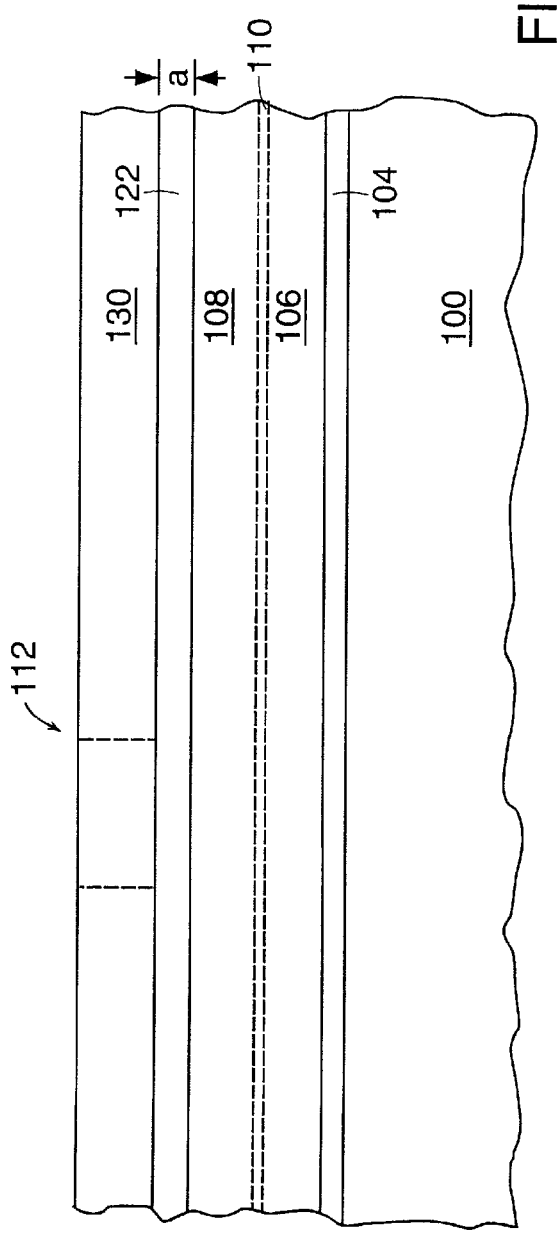
FIG. 3 is a cross-sectional view of the inventive modulator during fabrication, before the ridge etch.
Figure 4:
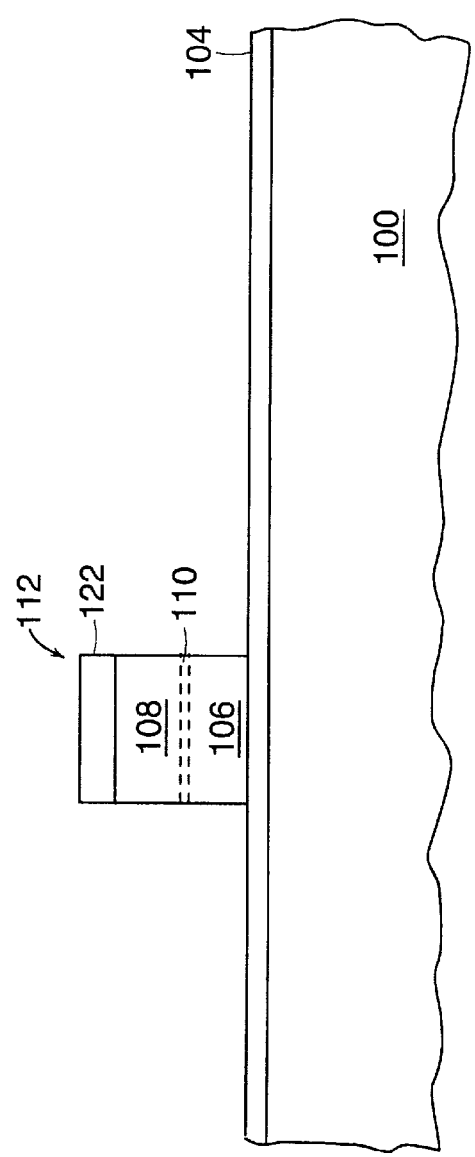
FIG. 4 is a cross-sectional view of the inventive modulator during fabrication, after the ridge etch.

As shown in FIG. 3, a silicon oxide layer 122 is deposited over substrate 100 and on epitaxial layers 104, 106, 108, 110. The preferred thickness of oxide layer 122 is 2200 Å. A first photoresist layer 130 is deposited on the silicon oxide layer 122. Using lithography processes, all of the first photoresist 130 is removed except for that over region 112. Oxide layer 122 is then removed in a dry, plasma etch, except for that portion of the oxide layer 122 under the remaining photoresist. A wet etch is then performed down to InGaAsP etch stop layer 104. This process produces the ridge structure 112 shown in FIG. 4.

In alternative embodiments, when diode lasers are being manufactured, the etch is typically not performed down to the depth of active layer 110.

Figure 5:
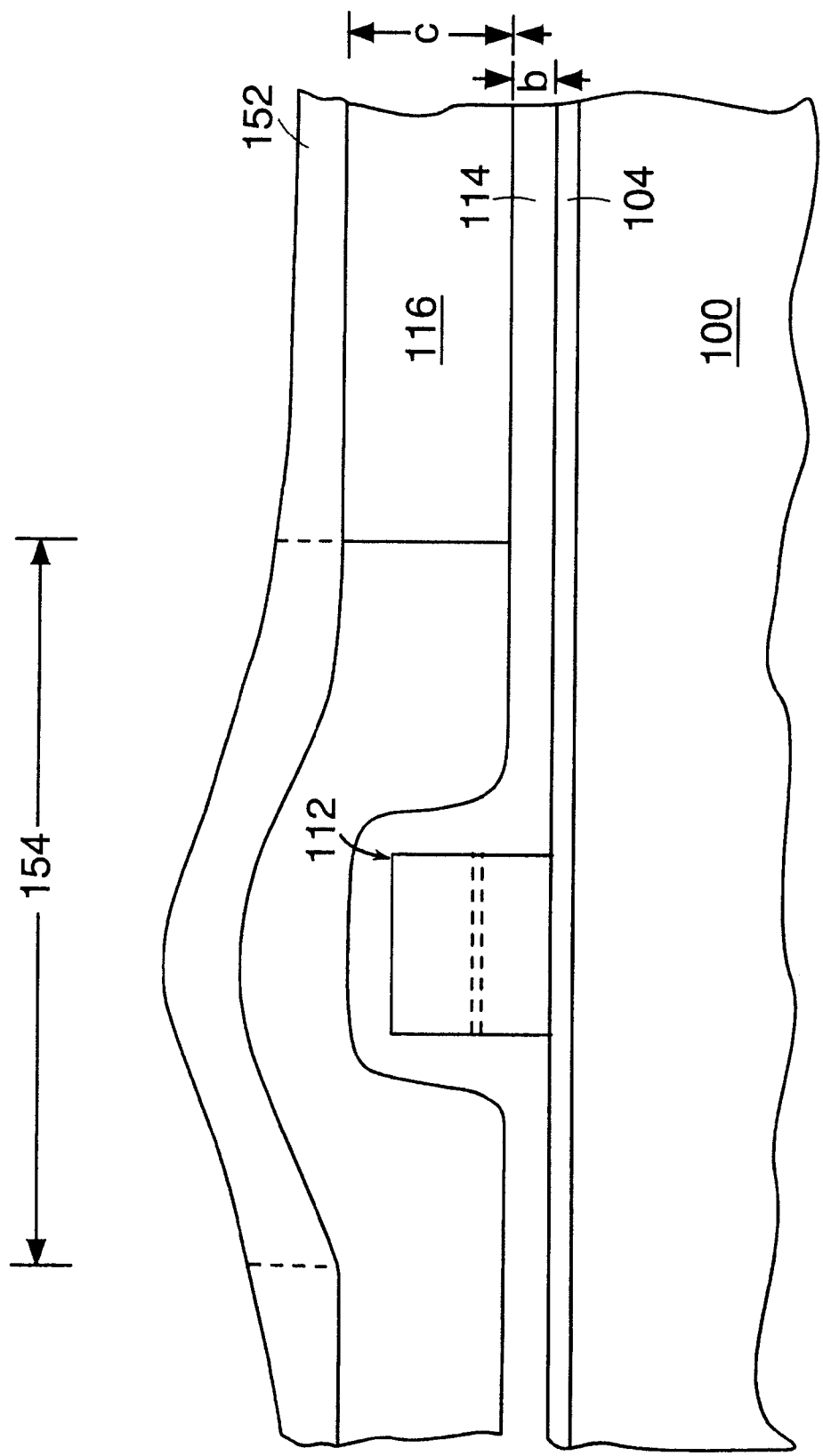
FIG. 5 is a cross-sectional view of the modulator after the deposition of the polyimide layer on the silicon oxide passivation layer.

FIG. 5 shows the deposition of the polyimide layer 116. Specifically, the remainder of the oxide layer 122 is removed from the top of the ridge 112. A silicon oxide passivation layer 114 is then coated over the surface of the device using preferably chemical vapor disposition. The thickness of the passivation layer 114 is approximately B=5,000 Å. Then, a thick polyimide layer, between 2 and 5 microns, is spun on over the silicon oxide passivation layer 114. In the preferred embodiment, the thickness is C=2.5 microns. Other polymeric dielectric materials may be used; the key feature is the compatibility with the semiconductor manufacturing process.

The surface of the passivation layer 114 is prepared prior to the polyimide deposition using an adhesion promoter. Presently, DuPont's Pyralin® brand organosilane is being used.

A second photoresist layer 152 is then coated over the polyimide layer 116 to facilitate its patterning. The second photoresist layer 152 in the region 154 surrounding the ridge 112 is first removed by photolithography processes. The polyimide is then etched using oxygen plasma etching in the preferred embodiment.

Figure 6:
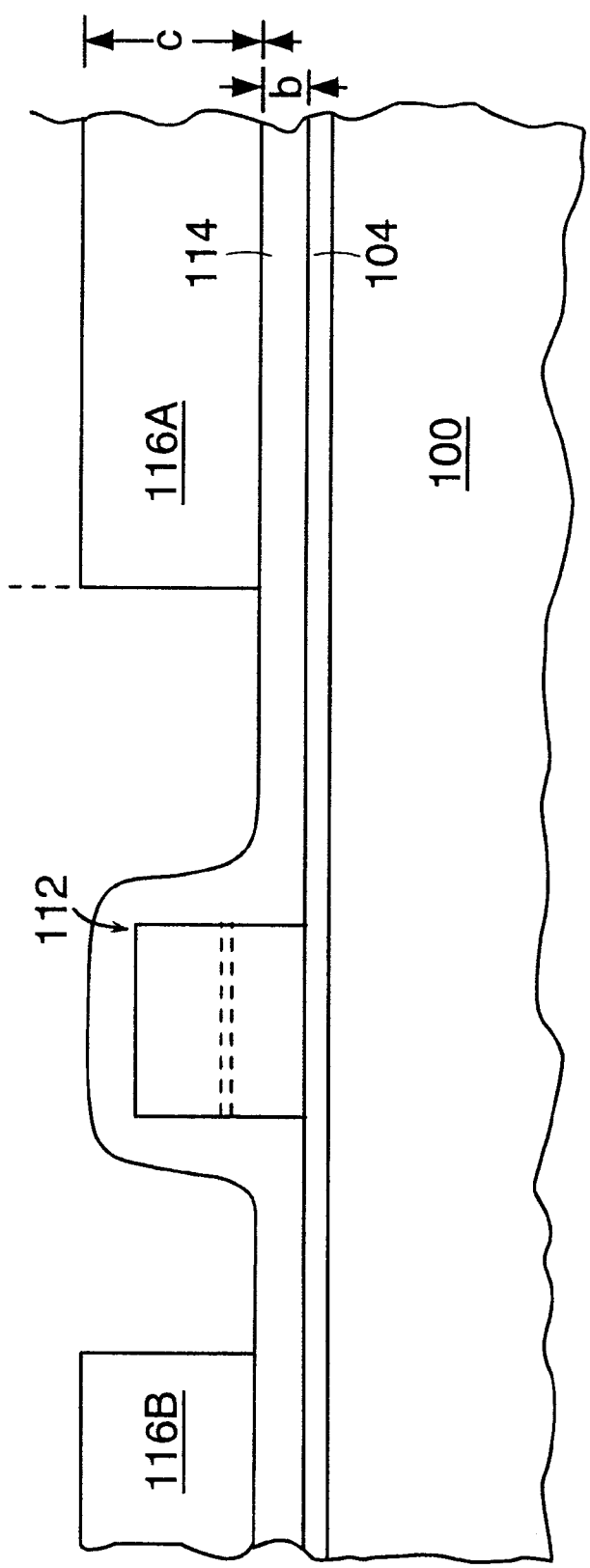
FIG. 6 shows the etching of the extent of the polyimide layer.

As shown in FIG. 6, after the photoresist layer 152 is completely removed, portions of the polyimide layer 116A and 116B are left on either side of the ridge 112. The portion 116A of the polyimide layer 116A extends under the entire region where the bond pad is to be formed.

Figure 7:
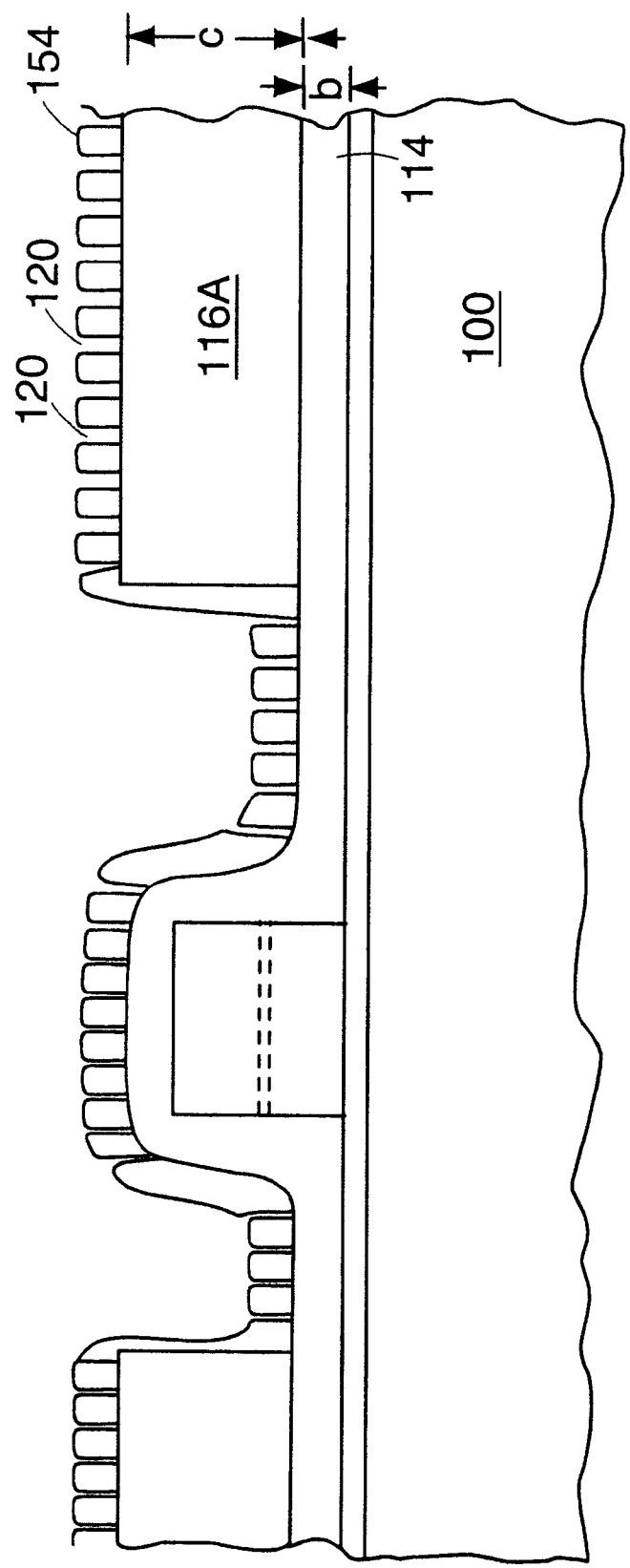
FIG. 7 shows the developed photoresist layer for patterning the polyimide layer.

FIG. 7 shows the steps associated with patterning the polyimide layer 116. Specifically, a third photoresist layer is deposited and then etched in the desired pattern for the polyimide layer 116. In the preferred embodiment, a series of wells 120 are formed at even spacings in the third photoresist layer 154. In the preferred embodiment, the thickness of the third photoresist layer 154 is approximately 1.5 microns. Thus, the photoresist layer is patterned in a grid, in the present embodiment.

Figure 8:
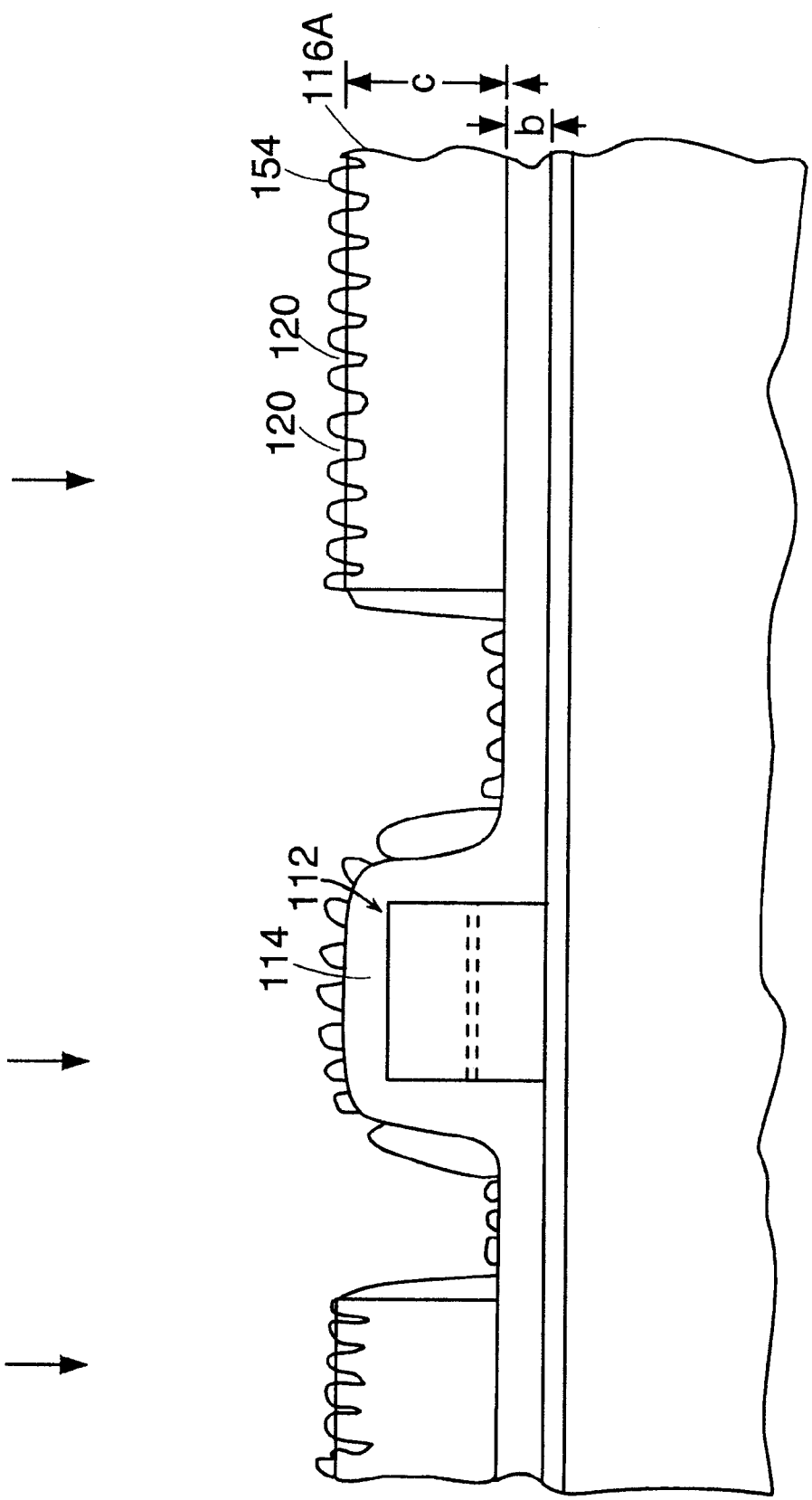
FIG. 8 shows the patterning etching of the polyimide layer.
Figure 9:
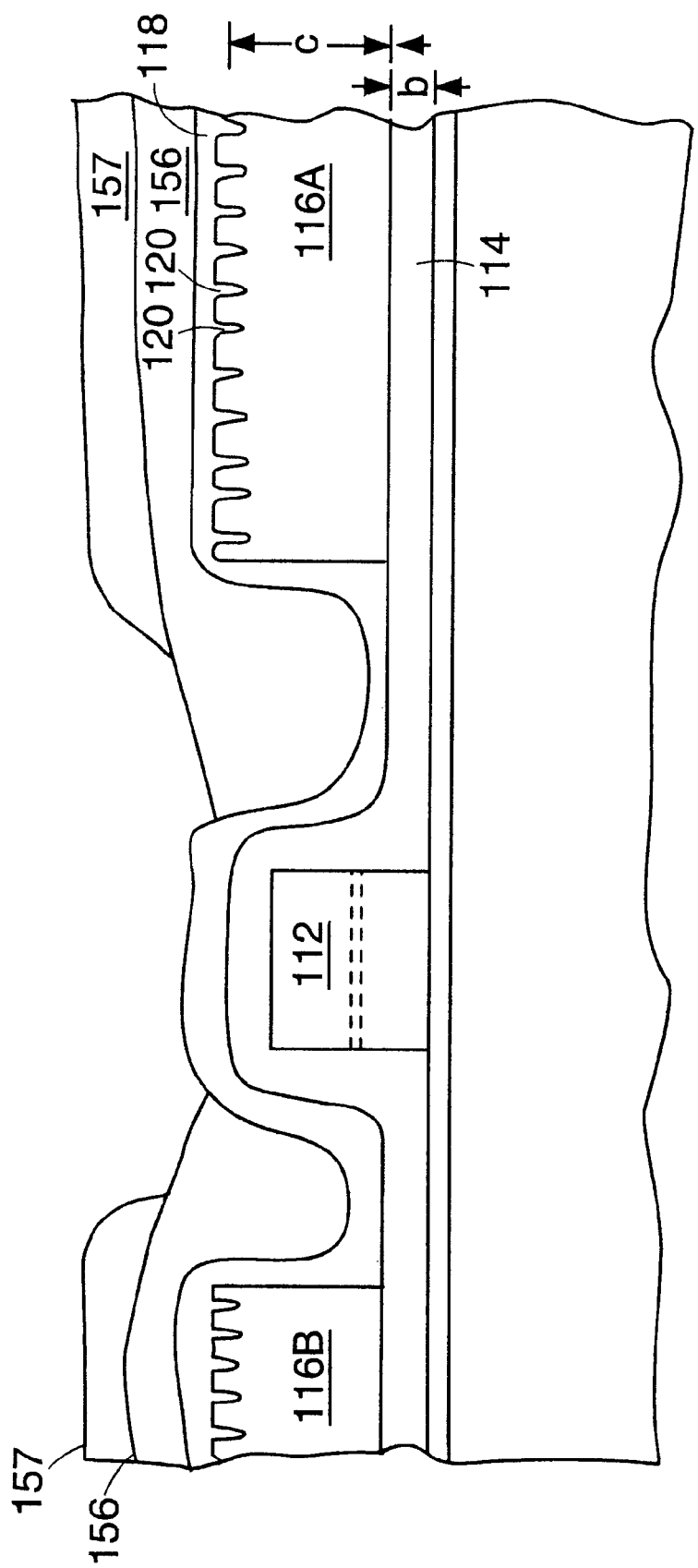
FIG. 9 shows the deposition of the silicon oxide interlayer and etched-back photoresist layer, exposing the ridge structure.

As shown in FIG. 8, the photoresist layer 154 and polyimide layer 116 are exposed to an oxygen plasma etch. This etch attacks both the remaining portions of the third photoresist 154 and exposed portions of the polyimide layer 116. There is approximately a 1:1 ratio in the etching efficiency of the photoresist relative to the polyimide. As a result, the wells 120 are etched into the polyimide layer 116A while the time of the etch is controlled such that the third photoresist 154 is not entirely removed from the top of the polyimide layer 116A. The oxygen plasma etch, however, does not attack the oxide layer 112 protecting the ridge 120. The remaining portions of the portions of the third photoresist layer 154 are then removed and the silicon oxide interlayer 118 is deposited as shown in FIG. 9. The silicon oxide layer fills into the wells 120 in the polyimide layer 116A to increase the surface area adhesion between the silicon oxide interlayer 118 and polyimide layer 116A. The formed wells 120 in the polyimide layer 116 increase the contact area between the polyimide and silicon oxide to provide a good net adhesion between the silicon oxide and polyimide of the bilayer, even though generally the adhesion of silicon oxide on polyimide is poor.

As also shown in FIG. 9, a fourth, hard-baked, photoresist layer 156 and a sixth, soft-baked photoresist layer 157 are next deposited, and then using lithography processes is removed in the regions surrounding the ridge 112. This is accomplished using a photoresist pullback technique in which oxygen plasma etching is first used followed by $CHF_3$ to etch the portions of oxide passivation layer 114 and interlayer 118 on top of the ridge 112.

Figure 10:
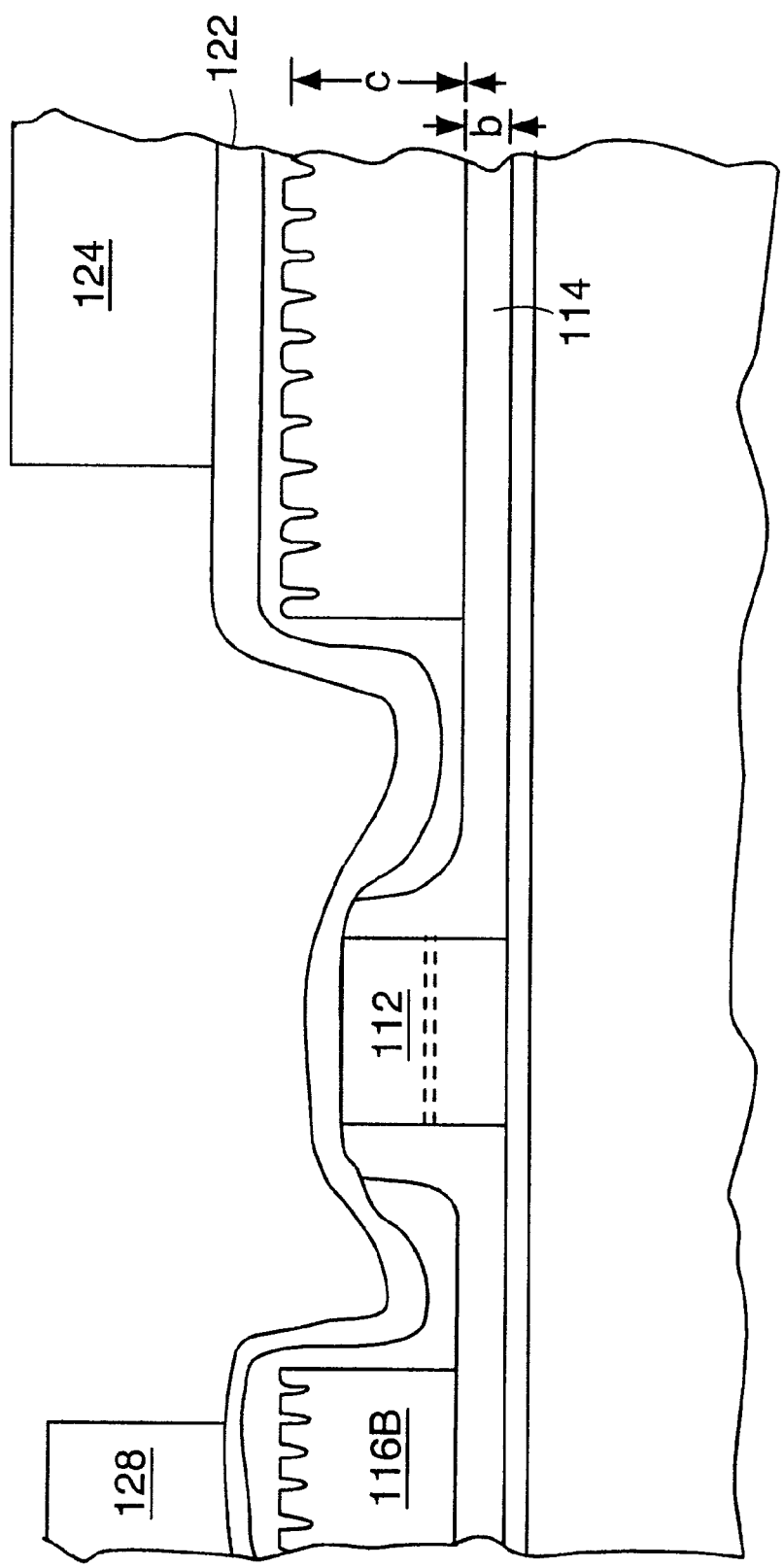
FIG. 10 shows the formation of the p-metal contact layer and bond pad.

Finally, as shown in FIG. 10, the photoresist layers 156 and 157 are removed. This exposes the ridge peak allowing the p-contact layer 122 to form an ohmic contact to the ridge. The gold bond pad 124, 128 is then formed on the polyimide pad 116A, 116B at both sides of the ridge 112.

Figure 11:
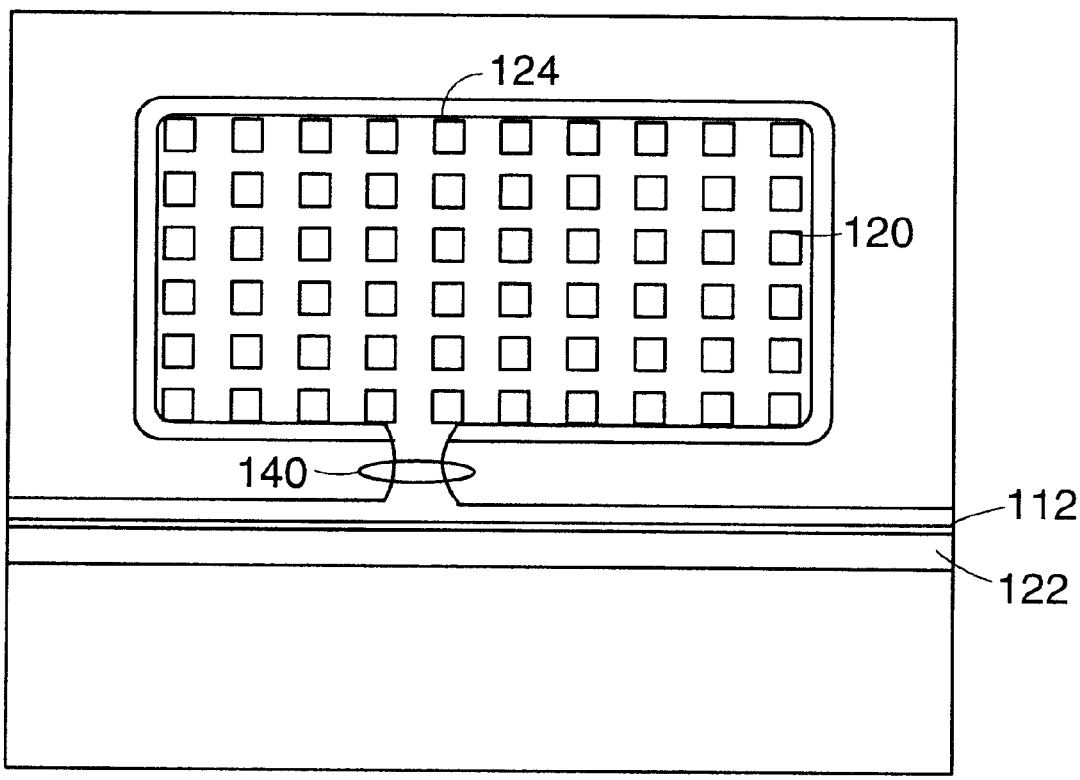
FIG. 11 is a top plan view of another embodiment of the inventive modulator in which the extent of the metal contact layer is reduced to further decrease capacitance.

FIG. 11 shows another embodiment of the present invention. This is a top view of a device similar to that shown in FIG. 2. The area 140 of the contact layer 122 between the pad 124 and the ridge 112 has been reduced. This further reduces parasitic capacitance.

Another approach is simply to reduce the size of the bond pad 124. There are limitations, however, in the minimum size for this bond pad due to the alignment accuracy of and wire ball size (126A) used in existing wire bonding technology.

Figure 12:
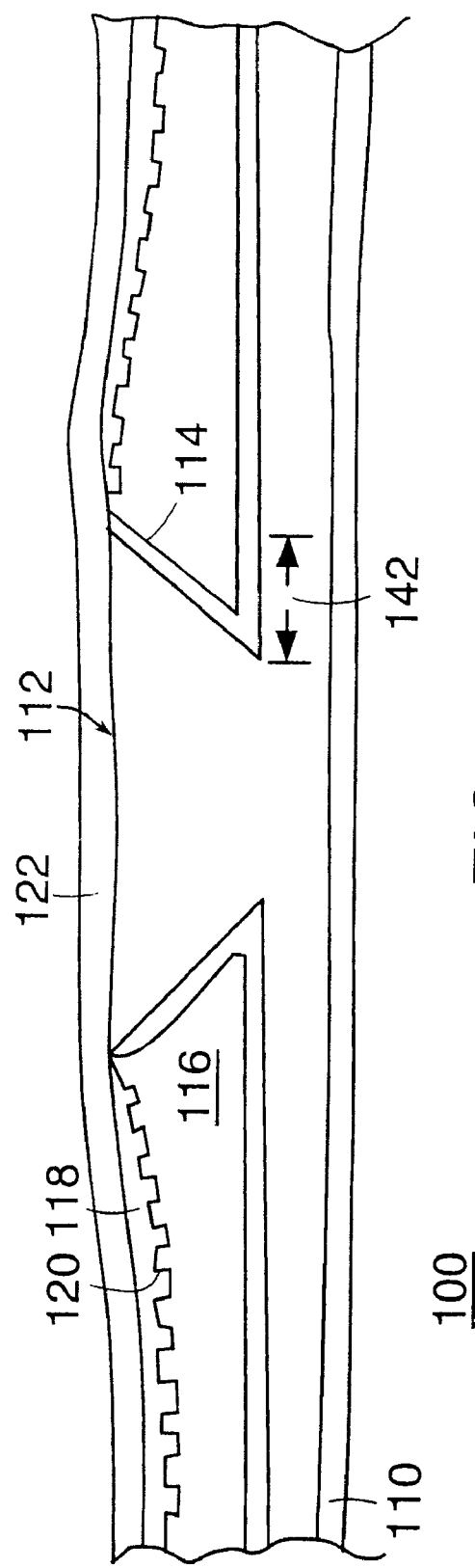
FIG. 12 is a cross-sectional view showing the application of the present invention to a reverse-ridge laser diode structure according to the invention.

FIG. 12 is a cross-section of another embodiment of the present invention in which similar features have been assigned the same reference numerals. This architecture uses a reverse ridge structure 112 in which the ridge etch is not performed to the depth of active layer 110. An advantage associated with using the polyimide layer 116 in this configuration is the fact that it coats well in the regions under the ridge overhangs 142 to provide planarization.

Figure 13:
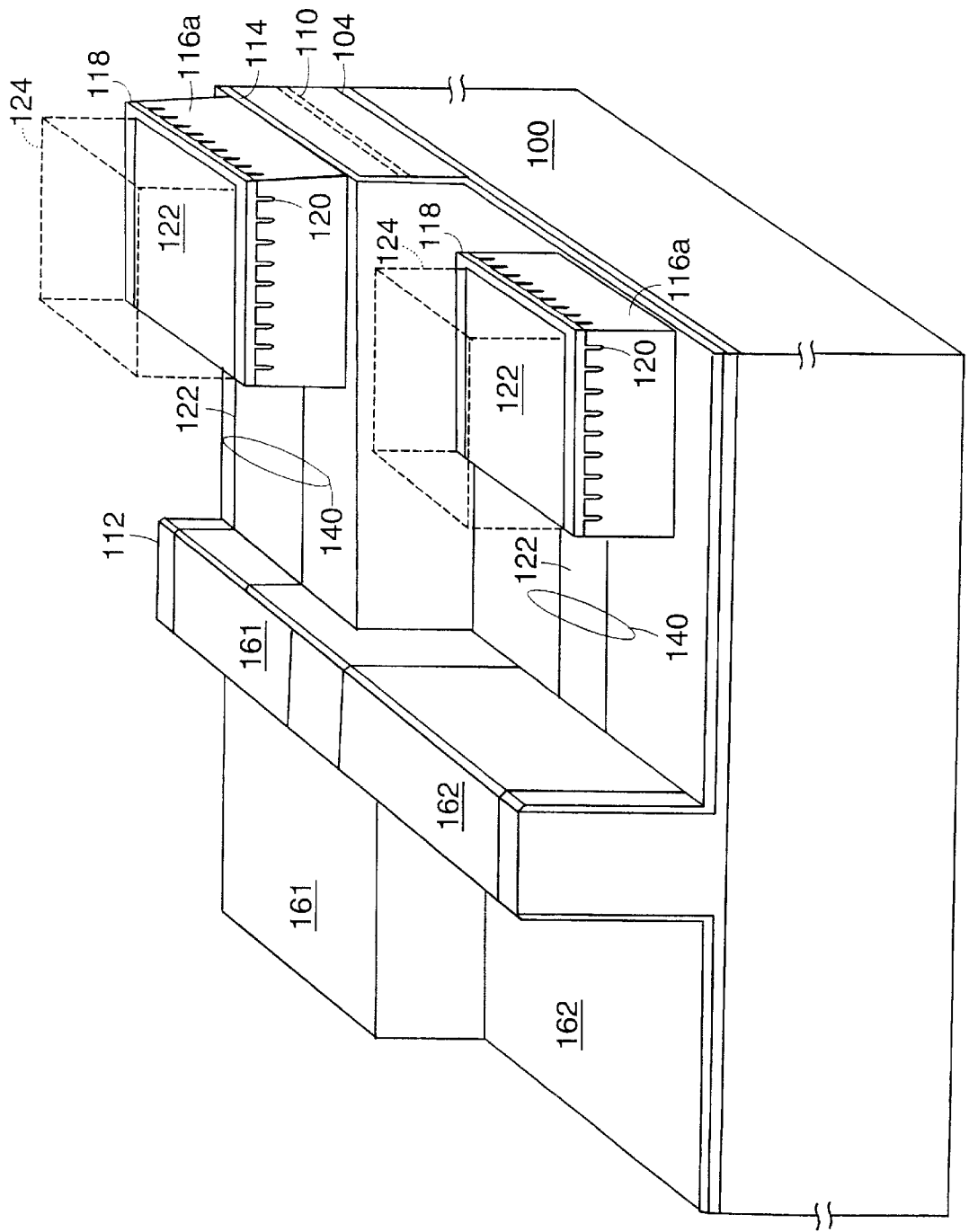
FIG. 13 shows another embodiment in which two different semiconductor electro-optical devices are integrated together, according to the present invention.

FIG. 13 shows another embodiment of the present invention. It integrates two different semiconductor electro-optical devices, both of which utilize the present invention to form wire bond pads 124 (shown in phantom) in order to reduce parasitic capacitance. One device 161 is preferably a laser with a ridge etch stopped above the active layer 110. The other device 162 is preferably an optical modulator, an amplifier, or a detector, which has the ridge 112 etched through the active layer 110, or staying at the same level as the laser 161. In both cases p-metal contact layer 122 connects the pads 124 to the device ridge 112.

Figure 14:
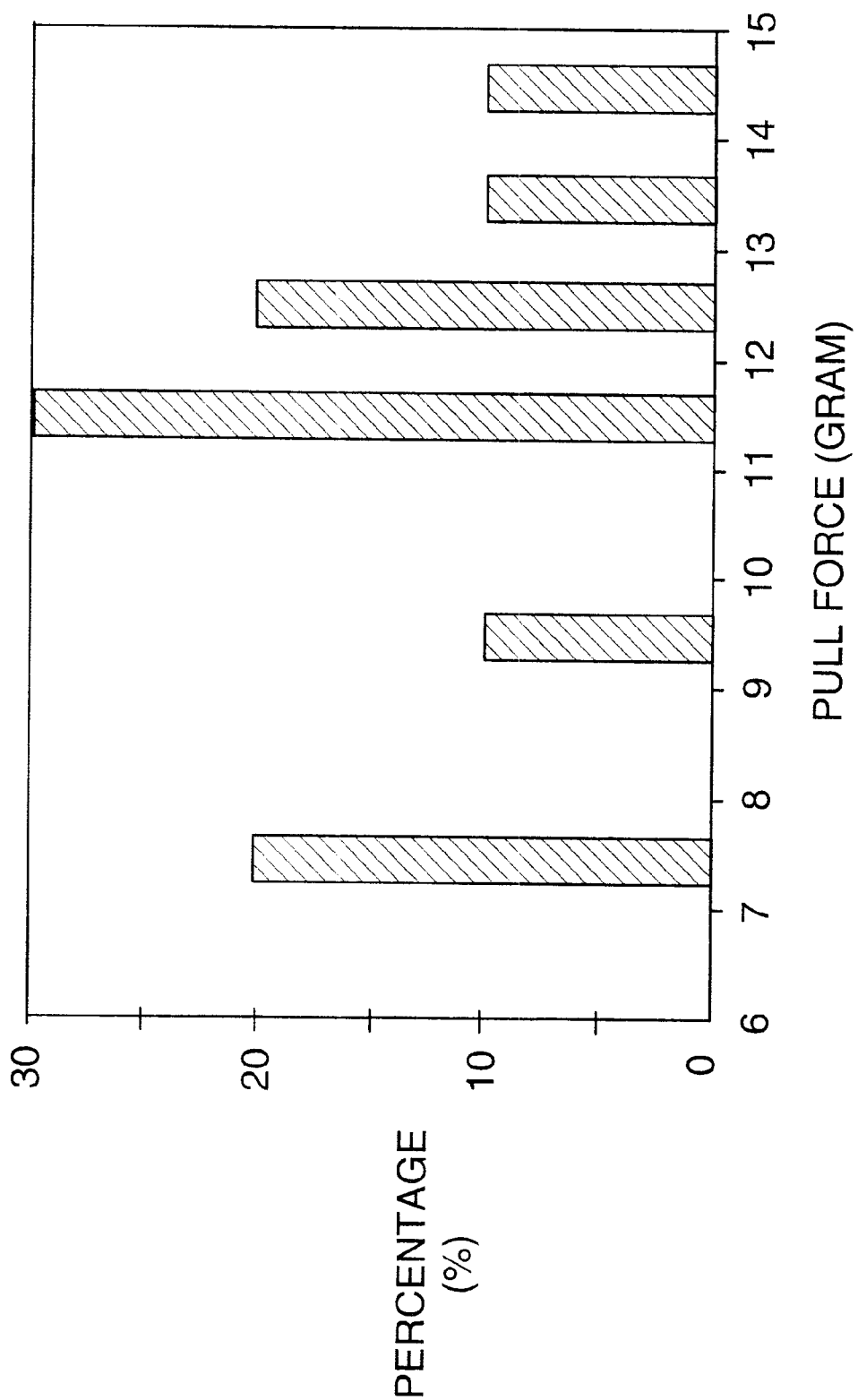
FIG. 14 is a graph showing the distribution of inventive devices as a function of pull force in grams required to separate the ultrasonically bonded wire.

FIG. 14 is a graph showing the distribution of devices utilizing the invention as a function of pull force in grams, i.e., the amount of force required to separate the wire (126) from the device (10). As demonstrated, the devices sustained pull forces of greater that 7 grams with many devices sustaining pull forces of 11 grams or higher. This compares favorably with existing commercial and military specifications requiring pull forces of only greater than 3 grams.

While this invention has been particularly shown and described with references to preferred embodiments thereof, it will be understood by those skilled in the art that various changes in form and details may be made therein without departing from the spirit and scope of the invention as defined by the appended claims. Those skilled in the art will recognize or be able to ascertain using no more than routine experimentation, many equivalents to the specific embodiments of the invention described specifically herein. Such equivalents are intended to be encompassed in the scope of the claims.

What is claimed is:

1. A semiconductor electro-optical device having a polyimide layer in which a silicon oxide interlayer is disposed over the polyimide layer to facilitate adhesion of a contact metal and bond pad wherein a surface of the polyimide includes a patterned series of etched wells that increase a contact area between the polyimide layer and the silicon oxide interlayer.

2. A semiconductor electro-optical device as claimed in claim 1, further comprising a silicon oxide passivation layer for attaching the polyimide layer to an underlying semiconductor material.

3. A semiconductor electro-optical device as claimed in claim 2, wherein the silicon oxide passivation layer comprises an adhesion promoter-enhanced surface.

4. A semiconductor electro-optical device as claimed in claim 1, wherein the pitch between the etched wells is 2 to 20 microns.

5. A semiconductor electro-optical device as claimed in claim 1, wherein the electro-optical device is a modulator.

6. A semiconductor electro-optical device as claimed in claim 1, wherein the electro-optical device is a laser.

7. A semiconductor electro-optical device as claimed in claim 1, the electro-optical device comprising a ridge-waveguide wherein the ridge has reverse-ridge configuration.

8. An electro-optical device, comprising:
   a ridge-waveguide;
   a polyimide layer surrounding the ridge-waveguide;
   a silicon oxide interlayer disposed over the polyimide layer; and
   a metal contact layer on the silicon oxide interlayer that transmits a ridge injection current wherein a surface of the polyimide includes a patterned series of etched wells that increase a contact area between the polyimide layer and the silicon oxide interlayer.

9. An electro-optical device as described in claim 8, further comprising a metal pad in electrical contact with the metal contact layer, the pad facilitating external electrical access to the metal contact layer.

10. An electro-optical device as described in claim 8, further comprising an adhesion layer between semiconductor material and polyimide.

11. An electro-optical device as described in claim 10, wherein the adhesion layer comprises adhesion promoter-enhanced silicon oxide.

12. An electro-optical device as described in claim 8, wherein a pitch of the etched wells is 1 to 20 microns.

13. An electro-optical device as described in claim 8, wherein the electro-optical device is a modulator.

14. An electro-optical device as described in claim 8, wherein the electro-optical device is a laser.

15. An electro-optical device as described in claim 8, wherein the ridge has reverse-ridge configuration.

\* \* \* \* \*